United States Patent
Fatemi et al.

(10) Patent No.: US 10,942,273 B2
(45) Date of Patent: Mar. 9, 2021

(54) PASSIVE MATRIX ADDRESSING OF OPTICAL PHASED ARRAYS

(71) Applicant: California Institute of Technology, Pasadena, CA (US)

(72) Inventors: Seyed Mohammadreza Fatemi, Pasadena, CA (US); Aroutin Khachaturian, Pasadena, CA (US); Behrooz Abiri, Pasadena, CA (US); Seyed Ali Hajimiri, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 316 days.

(21) Appl. No.: 15/896,005

(22) Filed: Feb. 13, 2018

(65) Prior Publication Data

US 2019/0056499 A1    Feb. 21, 2019

Related U.S. Application Data

(60) Provisional application No. 62/458,161, filed on Feb. 13, 2017.

(51) Int. Cl.
| | |
|---|---|
| *G01S 17/36* | (2006.01) |
| *G01S 7/491* | (2020.01) |
| *G02F 1/29* | (2006.01) |
| *H01Q 19/06* | (2006.01) |
| *G01S 7/481* | (2006.01) |
| *G01S 7/4915* | (2020.01) |
| *G11C 8/04* | (2006.01) |
| *G11C 8/12* | (2006.01) |

(52) U.S. Cl.
CPC ............ *G01S 17/36* (2013.01); *G01S 7/4817* (2013.01); *G01S 7/4915* (2013.01); *G02F 1/292* (2013.01); *G11C 8/04* (2013.01); *G11C 8/12* (2013.01); *H01Q 19/062* (2013.01)

(58) Field of Classification Search
CPC ...... G01S 17/36; G01S 7/4817; G01S 7/4915; G02F 1/292; G11C 8/04; G11C 8/12; H01Q 19/062
USPC ....................................... 356/5.01
See application file for complete search history.

(56) References Cited

U.S. PATENT DOCUMENTS

| | | | |
|---|---|---|---|
| 4,686,533 | A | 8/1987 | MacDonald et al. |
| 4,833,336 | A | 5/1989 | Kraske |
| 6,424,442 | B1 | 7/2002 | Gfeller et al. |
| 6,894,550 | B2 | 5/2005 | Trosa et al. |
| 7,313,295 | B2 | 12/2007 | Ghandi et al. |
| 7,539,418 | B1 | 5/2009 | Krishnamoorthy et al. |
| 7,623,783 | B2 | 11/2009 | Morris et al. |
| 8,244,134 | B2 | 8/2012 | Santori et al. |
| 8,311,417 | B1 | 11/2012 | Poggiolini et al. |
| 9,325,419 | B1 | 4/2016 | Kato |
| 9,557,585 | B1 | 1/2017 | Yap et al. |
| 10,382,140 | B2 | 8/2019 | Fatemi et al. |
| 2002/0174660 | A1 | 11/2002 | Venkatasubramanian |
| 2003/0090775 | A1 | 5/2003 | Webb et al. |
| 2004/0071386 | A1 | 4/2004 | Nunen et al. |
| 2004/0101227 | A1 | 5/2004 | Takabayashi et al. |
| 2004/0141753 | A1 | 7/2004 | Andreu-von Euw et al. |
| 2005/0084213 | A1 | 4/2005 | Hamann et al. |
| 2005/0138934 | A1 | 6/2005 | Weigert et al. |
| 2006/0034609 | A1 | 2/2006 | Morris et al. |
| 2006/0056845 | A1 | 3/2006 | Parsons et al. |
| 2008/0111755 | A1 | 5/2008 | Haziza et al. |
| 2008/0181550 | A1 | 7/2008 | Earnshaw |
| 2009/0297092 | A1 | 12/2009 | Takahashi |
| 2010/0158521 | A1 | 6/2010 | Doerr et al. |
| 2010/0187402 | A1 | 7/2010 | Hochberg et al. |
| 2010/0226658 | A1 | 9/2010 | Fujimoto et al. |
| 2011/0064415 | A1 | 3/2011 | Williams et al. |
| 2012/0087613 | A1 | 4/2012 | Rasras |
| 2012/0207428 | A1 | 8/2012 | Roelkens |
| 2012/0213531 | A1 | 8/2012 | Nazarathy et al. |
| 2013/0107667 | A1 | 5/2013 | Boufounos |
| 2015/0009068 | A1 | 1/2015 | Gregoire et al. |

(Continued)

FOREIGN PATENT DOCUMENTS

| | | |
|---|---|---|
| EP | 3094987 B1 | 12/2018 |
| WO | WO 2018/148758 A1 | 8/2018 |
| WO | WO 2018/165633 A1 | 9/2018 |

OTHER PUBLICATIONS

U.S. Appl. No. 15/587,391, Final Office Action dated Aug. 15, 2019.
U.S. Appl. No. 15/616,844, Notice of Allowance dated Mar. 27, 2019.
U.S. Appl. No. 15/728,245, Non-Final Office Action dated Apr. 17, 2019.
U.S. Appl. No. 15/728,329, Non-Final Office Action dated Jan. 30, 2019.
U.S. Appl. No. 15/728,329, Non-Final Office Action dated Sep. 9, 2019.
U.S. Appl. No. 15/917,536, Non-Final Office Action dated Aug. 7, 2019.
U.S. Appl. No. 15/917,536, Requirement for Restriction/Election dated Feb. 11, 2019.

(Continued)

*Primary Examiner* — Daniel L Murphy
(74) *Attorney, Agent, or Firm* — Alston & Bird LLP

(57) ABSTRACT

An optical phased array (OPA) includes, in part, a multitude of phase control elements disposed along N rows and M columns forming an N×M array. The phase control elements disposed along $i^{th}$ row are coupled to $i^{th}$ row signal line and phase control elements disposed along $j^{th}$ column are coupled to $j^{th}$ column signal line. The OPA further includes, in part, a row select block having N switches each configured to couple one of the N rows of the phase control elements to a digital-to-analog converter (DAC) in response to a row select signal. The OPA further includes, in part, a column select block having M switches each configured to couple one of the M rows of the phase control elements to a ground terminal in response to a column select signal.

25 Claims, 15 Drawing Sheets

(56) References Cited

U.S. PATENT DOCUMENTS

| | | |
|---|---|---|
| 2015/0198713 A1 | 7/2015 | Boufounos et al. |
| 2015/0336097 A1 | 11/2015 | Wang et al. |
| 2015/0357710 A1 | 12/2015 | Li et al. |
| 2016/0170141 A1 | 6/2016 | Luo et al. |
| 2016/0172767 A1 | 6/2016 | Ray |
| 2016/0266414 A1 | 9/2016 | Gill et al. |
| 2016/0276803 A1 | 9/2016 | Uesaka |
| 2017/0041068 A1 | 2/2017 | Murakowski et al. |
| 2017/0315387 A1 | 11/2017 | Watts et al. |
| 2017/0324162 A1 | 11/2017 | Khachaturian et al. |
| 2018/0101032 A1 | 4/2018 | Aflatouni et al. |
| 2018/0101083 A1 | 4/2018 | Aflatouni et al. |
| 2018/0123699 A1 | 5/2018 | Fatemi et al. |
| 2019/0089460 A1 | 3/2019 | Khachaturian et al. |

OTHER PUBLICATIONS

WIPO Application No. PCT/US2018/018070, PCT International Preliminary Report on Patentability dated Aug. 13, 2019.

WIPO Application No. PCT/US2018/021882, PCT International Preliminary Report on Patentability dated Sep. 10, 2019.

Bliss, et al., "Multiple-Input Multiple-Output (MIMO) Radar and Imaging: Degrees of Freedom and Resolution," Signals, Systems, and Computers (Asilomar) Conference, pp. 54-59, (2003).

Bogaerts, et al., "Low-loss, low-cross-talk crossings for silicon-on-insulator nanophotonic waveguides," Optics Letters, 32(19): 2801-2803, (2007).

Katz, et al., "Diffraction coupled phase-locked semiconductor laser array," Appl. Phys. Lett., 42(7): 554-556, (1983).

Liang, et al., "Tiled-aperture coherent beam combining using optical phase-lock loops," Electronics Letters, 44(14), (2008).

Resler, et al., "High-efficiency liquid-crystal optical phased-array beam steering," Opt. Lett., 21(9):689-691, (1996).

Vaidyanathan, et al., "Sparse sensing with coprime arrays," Signals, Systems, and Computers (Asilomar) Conference, pp. 1405-1409, (2010).

U.S. Appl. No. 15/616,844, Non-Final Office Action dated Jun. 1, 2018.

U.S. Appl. No. 15/728,329, Non-Final Office Action dated Jan. 19, 2018.

WIPO Application No. PCT/US2018/018070, PCT International Search Report and Written Opinion of the International Searching Authority dated Apr. 27, 2018.

WIPO Application No. PCT/US2018/021882, PCT International Search Report and Written Opinion of the International Searching Authority dated Jun. 7, 2018.

U.S. Appl. No. 15/616,844, Response to Non-Final Office Action filed Dec. 3, 2018.

U.S. Appl. No. 15/728,329, Final Office Action dated Aug. 3, 2018.

U.S. Appl. No. 15/728,329, Response to Non-Final Office Action filed Jul. 18, 2018.

U.S. Appl. No. 15/587,391, Non-Final Office Action dated Dec. 13, 2018.

U.S. Appl. No. 15/728,245, Final Office Action dated Dec. 6, 2019.

U.S. Appl. No. 15/728,329, Response to Final Office Action filed Jan. 16, 2019.

U.S. Appl. No. 15/587,391, Non-Final Office Action dated Mar. 19, 2020.

U.S. Appl. No. 15/917,536, Final Office Action dated May 14, 2020.

EP 18764449.7 Extended Suroepean Search Report dated Nov. 24, 2020.

PASSIVE MATRIX ADDRESSING OF OPTICAL PHASED ARRAYS

CROSS REFERENCE TO RELATED APPLICATIONS

The present application claims benefit under 35 USC 119(e) of U.S. provisional Application No. 62/458,161, filed Feb. 13, 2017, entitled "Passive Matrix Addressing of Optical Phased Arrays", the content of which is incorporated herein by reference in its entirety.

FIELD OF THE INVENTION

The present invention relates to photonics, and more particularly, to optical phased arrays.

BACKGROUND OF THE INVENTION

Optical phased arrays have potential applications in light detection and ranging (LIDAR), free space communication, optical switching, imaging, and projection systems. As the number of elements in a phased array increases, routing of the control signals to the phased array elements poses a challenge. Moreover, the number of required electrical drivers increases with the increase in the number of elements, which increases the overall power consumption of the system.

Conventional passive matrix addressing in digital memories (SRAM, DRAM) select one of N×M elements using N+M control lines. The N×M elements are arranged in N rows and M columns. Each of the N rows and M columns uses a different shared bus. To select and program a memory element in row i and column j, only the bus lines corresponding to that column and row are selected. Accordingly, the memory elements are programmed one at a time. The memory associated with each element provides for the retention of the programmed value while other memory elements of the array are being programmed.

In a conventional passive matrix addressing, as N and M increase, more area and metal layers will be required thus the making the routing more complex and challenging. Furthermore, the number of drivers for programming these memory elements increases which in turn increases the overall system power consumption.

SUMMARY OF THE INVENTION

An optical phased array, in accordance with one embodiment of the present invention, includes, in part, a multitude of phase control elements disposed along N rows and M columns forming an N×M array, wherein phase control elements disposed along the $i^{th}$ row are coupled to the $i^{th}$ row signal line and phase control elements disposed along the $j^{th}$ column are coupled to the $j^{th}$ column signal line, wherein N and M are positive integers, wherein i is a row index varying from 1 to N, and wherein j is a column index varying from 1 to M. The optical phased array further includes, in part, a row select block having N switches each configured to couple one of the N rows of the phase control elements to a digital-to-analog converter (DAC) in response to a row select signal. The DAC may be external to the photonic chip that includes the phased array or it may be integrated on the same die that includes the photonic chip. The optical phased array further includes, in part, a column select block having M switches each configured to couple one of the M columns of the phase control elements to a ground terminal in response to a column select signal.

In one embodiment, the optical phased array further includes, in part, N×M diodes each coupled in series to a different one of the N×M phase control elements. In one embodiment, the diode is inherent or part of the phase modulator element structure. In one embodiment each phase control element has an internal memory. In one embodiment, each phase control element is a thermal phase shifter. In one embodiment, each phase control element is a capacitive phase shifter. In one embodiment, each capacitive phase shifter is a P-N diode. In one embodiment, each capacitive phase shifter is a Schottky diode. In one embodiment, each capacitive phase shifter includes a layer of polymer having dipole molecules whose polarity is varied.

In one embodiment, each phase control element includes a memory external to the phase control element. In one embodiment, each external memory includes, in part, a shift register and a DAC. In one embodiment, the row select signal is a pulse-width modulated signal. In one embodiment, the row select signal is controlled to select between different N row switches at a first constant rate. In one embodiment, the column select signal is controlled to select between different N column switches at a second constant rate. In one embodiment, the first constant rate is substantially equal to the second constant rate. In one embodiment, the switch time varies for different rows and/or columns. second constant rate. In one embodiment, the switch time varies for different rows and/or columns.

An optical phased array, in accordance with one embodiment of the present invention, includes, in part, a multitude of phase control elements disposed along N rows and M columns forming an N×M array, wherein phase control elements disposed along the $i^{th}$ row are coupled to the $i^{th}$ row signal line and phase control elements disposed along the $j^{th}$ column are coupled to the $j^{th}$ column signal line, wherein N and M are positive integers, wherein i is a row index varying from 1 to N, and wherein j is a column index varying from 1 to M, wherein each row signal line is coupled to a different one of N digital-to-analog converters (DACs) of the optical phased array. The optical phased array further includes, in part, a column select block having M switches each configured to couple one of the M columns of the phase control elements to a ground terminal in response to a column select signal. In one embodiment, the optical phased array of further includes, in part, N×M diodes each coupled in series to a different one of the N×M phase control elements. In one embodiment, the diode is inherent or part of the phase modulator element structure.

An optical phased array, in accordance with one embodiment of the present invention, includes, in part, a multitude of phase control elements disposed along N rows and M columns forming an N×M array, wherein phase control elements disposed along the $i^{th}$ row are coupled to the $i^{th}$ row signal line and phase control elements disposed along the $j^{th}$ column are coupled to the $j^{th}$ column signal line, wherein N and M are positive integers, wherein i is a row index varying from 1 to N, and wherein j is a column index varying from 1 to M. The optical phased array further includes, in part, a row select block having N switches each configured to couple one of the N rows of the phase control elements to a fixed DC voltage supply in response to a row select signal, wherein said row select signal is a pulse-width modulated signal. The optical phased array further includes, in part, a column select block having M switches each configured to couple one of the M columns of the phase control elements to a ground terminal in response to a column select signal.

In one embodiment, the optical phased array further includes, in part, N×M diodes each coupled in series to a different one of the N×M phase control elements. In one embodiment, the diode is inherent or part of the phase modulator element structure.

An optical phased array, in accordance with one embodiment of the present invention includes, in part, a multitude of phase control elements disposed along N rows and M columns forming an N×M array, wherein phase control elements disposed along the $i^{th}$ row are coupled to the $i^{th}$ row signal line and phase control elements disposed along the $j^{th}$ column are coupled to the $j^{th}$ column signal line, wherein N and M are positive integers, wherein i is a row index varying from 1 to N, and wherein j is a column index varying from 1 to M, wherein each row signal line is coupled to a different one of a first N digital-to-analog converters (DACs) of the optical phased array, and wherein each column signal line is coupled to a different one of a second M DACs of the optical phased array. In one embodiment, the optical phased array further includes, in part, N×M diodes each coupled in series to a different one of the N×M phase control elements. In one embodiment, the diode is inherent or part of the phase modulator element structure.

A method of forming an optical phased array, in accordance with one embodiment of the present invention, includes, in part, forming a multitude of phase control elements disposed along N rows and M columns forming an N×M array, wherein phase control elements disposed along the $i^{th}$ row are coupled to the $i^{th}$ row signal line and phase control elements disposed along the $i^{th}$ column are coupled to the $i^{th}$ column signal line, wherein N and M are positive integers, wherein i is a row index varying from 1 to N, and wherein j is a column index varying from 1 to M. The method further includes, in part, forming a row select block having N switches each configured to couple one of the N rows of the phase control elements to a digital-to-analog converter (DAC) in response to a row select signal. The method further includes, in part, forming a column select block having M switches each configured to couple one of the M columns of the phase control elements to a ground terminal in response to a column select signal.

A method of forming an optical phased array, in accordance with one embodiment of the present invention, includes, in part, forming a multitude of phase control elements disposed along N rows and M columns forming an N×M array, wherein phase control elements disposed along the $i^{th}$ row are coupled to the $i^{th}$ row signal line and phase control elements disposed along the $j^{th}$ column are coupled to the $i^{th}$ column signal line, wherein N and M are positive integers, wherein i is a row index varying from 1 to N, and wherein j is a column index varying from 1 to M, wherein each row signal line is coupled to a different one of N digital-to-analog converter (DACs) of the optical phase array. The method further includes, in part, forming a column select block having M switches each configured to couple one of the M columns of the phase control elements to a ground terminal in response to a column select signal.

A method of forming an optical phased array, in accordance with one embodiment of the present invention, includes, in part, forming a multitude of phase control elements disposed along N rows and M columns forming an N×M array, wherein phase control elements disposed along the $i^{th}$ row are coupled to the $i^{th}$ row signal line and phase control elements disposed along the $i^{th}$ column are coupled to the $i^{th}$ column signal line, wherein N and M are positive integers, wherein i is a row index varying from 1 to N, and wherein j is a column index varying from 1 to M. The method further includes, in part, forming a row select block having N switches each configured to couple one of the N rows of the phase control elements to a fixed DC voltage supply in response to a row select signal, wherein said row select signal is a pulse-width modulated signal. The method further includes, in part, forming a column select block having M switches each configured to couple one of the M columns of the phase control elements to a ground terminal in response to a column select signal.

A method of forming an optical phased array in accordance with one embodiment of the present invention, includes, in part, forming a multitude of phase control elements disposed along N rows and M columns forming an N×M array, wherein phase control elements disposed along the $i^{th}$ row are coupled to the $i^{th}$ row signal line and phase control elements disposed along the $i^{th}$ column are coupled to the $j^{th}$ column signal line, wherein N and M are positive integers, wherein i is a row index varying from 1 to N, and wherein j is a column index varying from 1 to M, wherein each row signal line is coupled to a different one of a first N digital-to-analog converters (DACs) of the optical phased array, and wherein each column signal line is coupled to a different one of a second M DACs of the optical phased array.

DETAILED DESCRIPTION OF THE INVENTION

In accordance with one embodiment of the present invention, the addressing of an N×M array of phased modulator elements (alternatively referred to herein as elements) of a phased array is achieved using N+M number of control lines. In yet other embodiment, the phase modulator elements may be programmed using only two electrical connections. In the following description, update rate refers to the frequency that an entire array of phase modulator elements is programmed, and refresh rate refers to the frequency required for reprogramming a phase modulator element so that it maintains its value. The refresh rate is equal to or larger than update rate.

Figure 1:
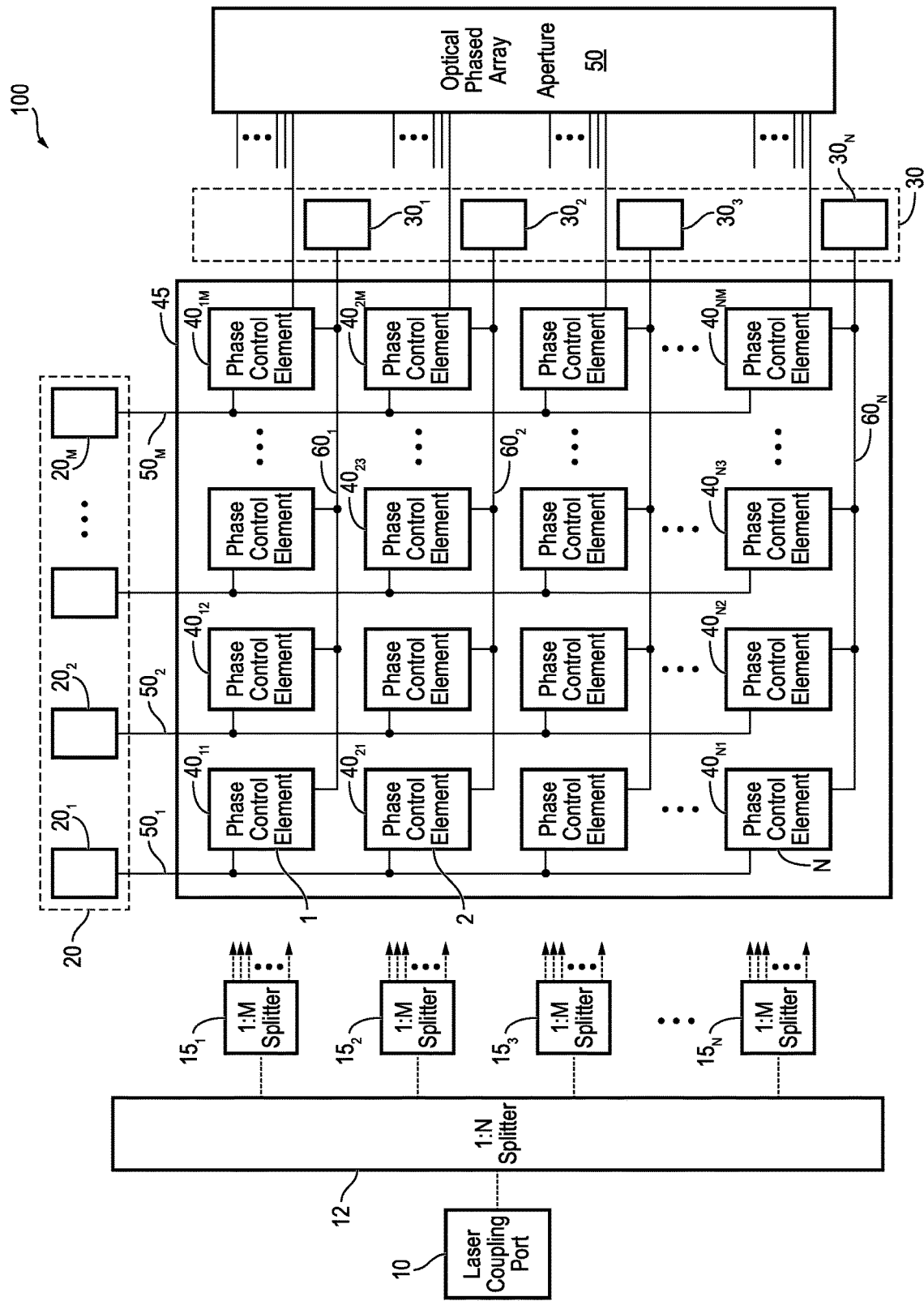
FIG. 1 is a simplified high-level block diagram of an exemplary N×M optical phased array, in accordance with one embodiment of the present invention.

FIG. 1 is a simplified high-level block diagram of an exemplary N×M optical phased array (OPA) 100. OPA 100 is shown as including, in part, an N×M OPA phase control block 45, an OPA aperture 50, a row select block 30, a column select block 20, a laser coupling port 10, a 1-to-N beam splitter 12, and N 1-to-M beam splitters $15_i$, where i is an index ranging from 1 to N in this example.

Beam splitter 12 is adapted to split the laser beam it receives from laser coupling port 10 into N separate beams, each delivered to a different one of the 1-to-M splitters $15_i$. Each beam splitter $15_i$ splits the beam it receives to M separate beams each delivered to a different one of the M phase modulator elements disposed in that row.

As shown, phase control block 45 includes N×M phase modulator elements (alternatively referred to herein as phase control element) disposed along N rows and M columns. For example, disposed along row 1 of array 45, are phase control elements $40_{11}, 40_{12} \ldots 40_{1M}$. Likewise, disposed along row N of array 45, are phase control elements $40_{N1}, 40_{N2} \ldots 40_{NM}$. Accordingly, in the following description, phase control element $40_{ij}$ refers to the phase control element disposed in row i—which ranges from 1 to N—and column j—which ranges from 1 to M. Therefore, each of the M separate beams (optical paths) supplied by beam splitter $15_i$ is delivered to a different one of the M phase control elements $40_{iM}$. For example, each of the M separate beams supplied by beam splitter 151 is delivered to a different one of the M phase control elements $40_{11}, 40_{12} \ldots 40_{1M}$.

OPA 100 is also shown as including M column electrical signal lines $50_1, 50_2 \ldots 50_M$, and N row electrical signal lines $60_1, 60_2 \ldots 60_N$. In other words, each row uses one shared bus and each column bus uses one shared bus. To select and program the phase control element disposed in row i and column j, only the bus lines corresponding to that column and row are selected. This enables the phase control elements to be programmed either sequentially one at a time, or one row/column at a time, or using some other scheme. The memory of each phase control element enables the retention of the programmed value while other elements are being programmed.

As described above, column signal line (alternatively referred to herein as column) $50_j$ provides an electrical signal for all the phase control elements disposed in column j. Similarly, row signal line (alternatively referred to herein as row) $60_i$ provides an electrical signal for all the phase control elements disposed in row i. A phase control element selected by row select block 30 and column select block 20 gets connected to its associated row and column signal lines and is thus programmed to provide the required modulation level. For example, when row select block 30 and column select block 20 cause phase control element $40_{23}$ to be selected (through selection of row $60_2$ and column $50_3$) phase control element $40_{23}$ receives the electrical signals supplied by row signal line $60_2$ and column signal line $50_3$ thereby resulting in programming of phase control element $40_{23}$.

Figure 2A:
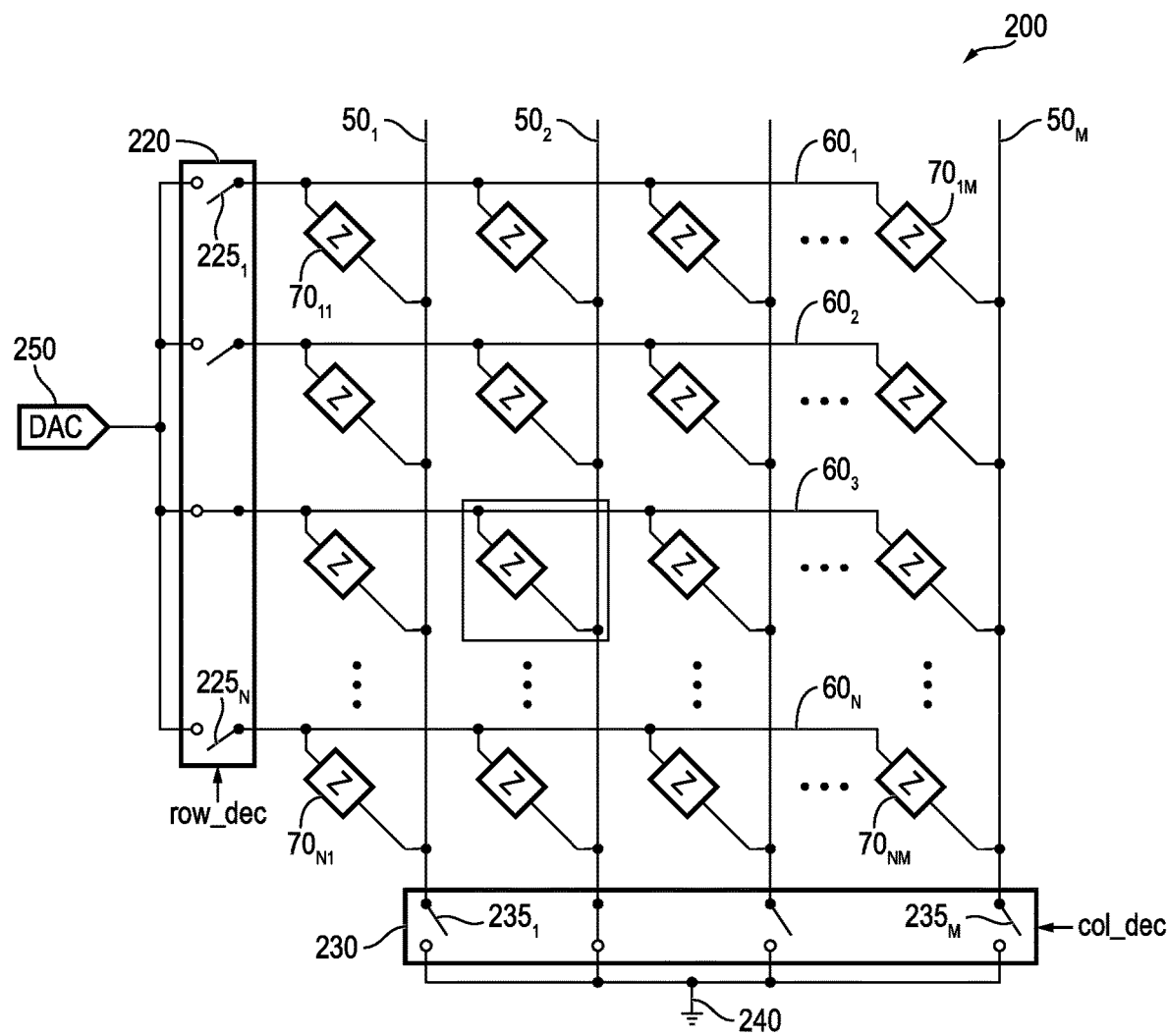
FIG. 2A is a simplified high-level block diagram of an array of phase control elements disposed along N rows and M columns, in accordance with one embodiment of the present invention.

FIG. 2A is a simplified high-level block diagram of an N×M array 200 of phase control elements, in accordance with one embodiment of the present invention. Array 200 is part of an optical phased array similar to that shown in FIG. 1. However, for clarity and simplicity, the remaining components of FIG. 1 are not shown in FIG. 2A. Array 200 of optical phase control elements is shown as including M column signal lines $50_1, 50_2 \ldots 50_M$ and N row signal lines $60_2 \ldots 60_N$. Each phase control element $70_{ij}$ is shown as being connected to an associated row signal line and an associated column signal line. For example, phase control element $70_{11}$ is shown as being connected to row $60_1$ and column $50_1$. Similarly, phase control element $70_{NM}$ is shown as being connected to row $60_N$ and column $50_M$.

At any given time during programming, signal row_dec selects and closes one of switches $225_i$, where i is an index ranging from 1 to N, thereby causing all the phase control elements connected to that switch's associated row signal line to be coupled to Digital-to-Analog converter (DAC 250). For example, when signal row_dec is selected to close switch $225_1$, all phase control elements $70_{11}$ to $70_{1M}$ are coupled to DAC 250. Similarly, signal col_dec selects and closes one of switches $235_j$, where j is an index ranging from 1 to M, thereby causing all phase control elements connected to column j signal line (50) to receive the ground potential via ground terminal 240. For example, when signal col_dec is selected to close switch $235_M$, all phase control elements $70_{1M}$ to $70_{NM}$ are coupled to column signal line $50_M$.

Therefore, by causing, for example, switches $225_1$ and $235_M$ to close, phase control element $70_{1M}$ is coupled between DAC 250 and ground terminal 240, thereby causing element $70_{1M}$ to be programmed. In addition, part of the power drawn from the selected row and column is delivered to the other elements that are not in the selected row and column, thus causing the unselected phase control elements to partially receive power, thereby relaxing the update time.

In accordance with one aspect of the present invention, rows $60_i$ are caused to be connected to DAC 250 at regular time intervals. In other embodiments, rows $60_i$ are caused to be connected to DAC 250 at a constant rate. Similarly, in accordance with one aspect of the present invention, columns $50_j$ are caused to be connected to ground terminal 240 at regular time intervals. In other embodiments, columns $50_j$ are caused to be connected to ground terminal 240 at a constant rate. By closing switches $225_i$ and $235_j$ at, e.g., a constant rate, elements $70_{ij}$ of the array are programmed. As seen from FIG. 2A, an optical phased array, of which array 200 is a part, requires only two external connections, one to DAC 250 and another one to ground terminal 240. Furthermore, assuming $\tau_p$ represents the time it takes to program one element $70_{ij}$, the entire array of phase control elements is programmed in $NM\tau_p$. In one embodiment DAC 250 generates the same voltage for all the rows. In yet other embodiments, DAC 250 may generate different voltages for different rows and at different times.

Figure 2B:
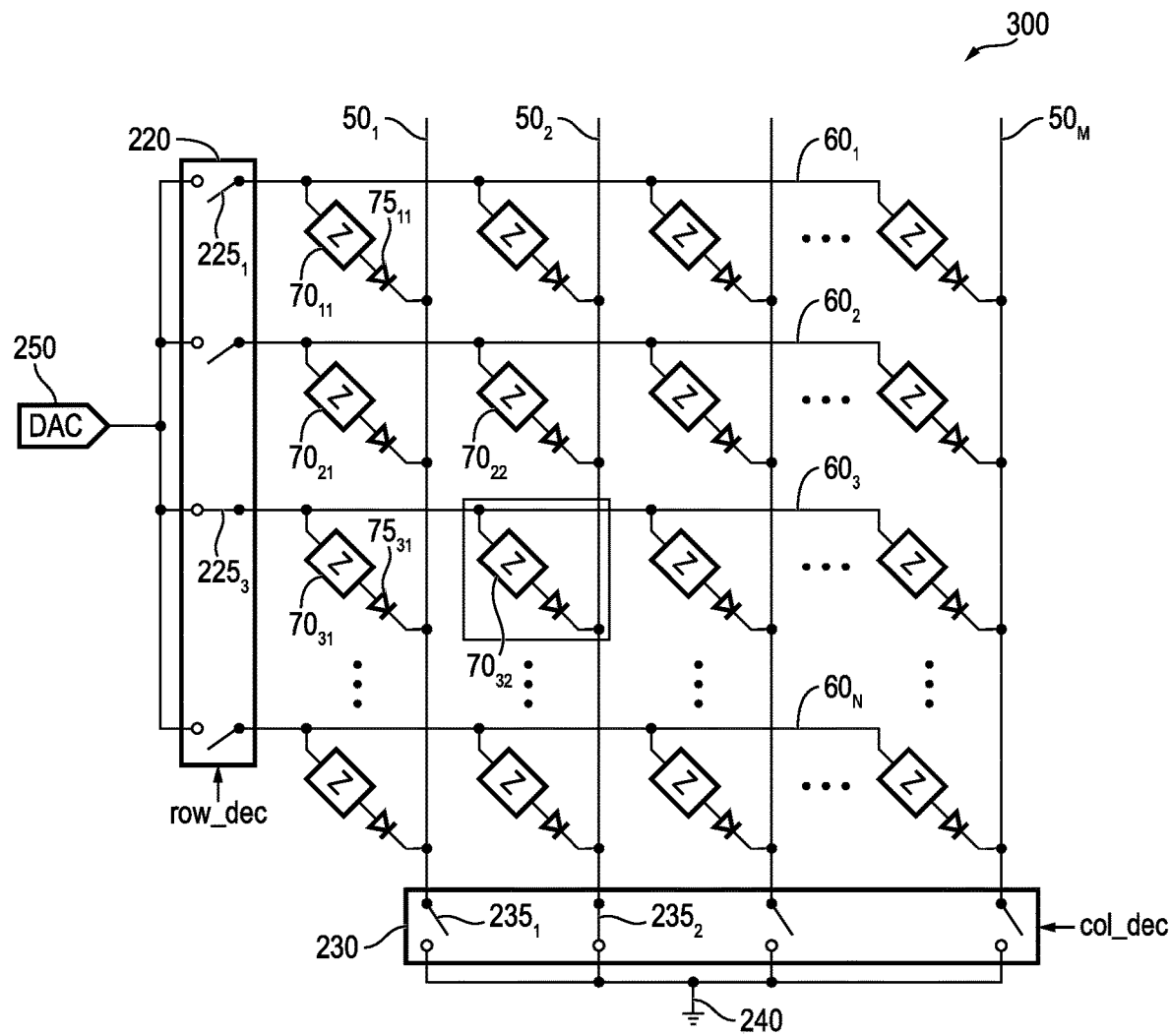
FIG. 2B is a simplified high-level block diagram of an array of phase control elements disposed along N rows and M columns, in accordance with one embodiment of the present invention.

FIG. 2B is a simplified high-level block diagram of an N×M array 300 of phase control elements, in accordance with another embodiment of the present invention. Array 300 is similar to array 200 except that in array 300, in series with each phase control element $70_i$ is a diode $75_{ij}$ that causes current to flow only in one direction from the positive to negative terminals of the diode and thus to inhibit the current flow in unselected phase control elements. For example, assume that switches $225_3$ and $235_2$ are closed to select phase control element $70_{32}$. In the absence of the diodes, the voltage on row $60_3$ would cause a voltage to develop on, for example, column $50_1$ through phase control element $70_{13}$. The voltage so developed causes a current to flow through phase control element $70_{21}$ thus charging row $60_2$, which in turn causes a current to flow to the ground through phase control element $70_{22}$ which was not selected. Diodes $75_{ij}$ inhibit current flow through unselected phase control elements. Therefore, each element can be programmed independently at its dedicated time period.

Figure 3A:
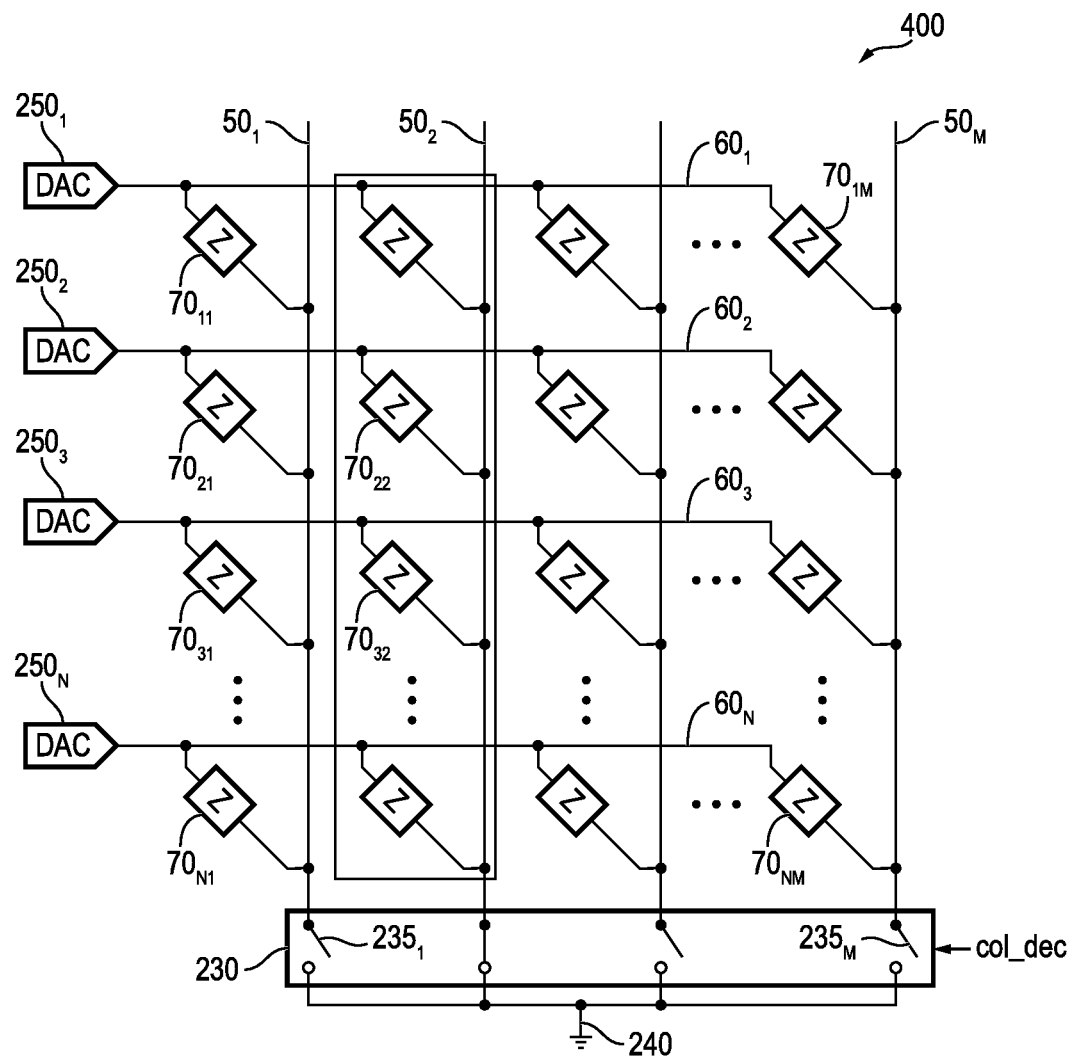
FIG. 3A is a simplified high-level block diagram of an array of phase control elements disposed along N rows and M columns, in accordance with one embodiment of the present invention.

FIG. 3A is a simplified high-level block diagram of an N×M array 400 of phase control elements, in accordance with one embodiment of the present invention. Array 400 is part of an optical phased array similar to that shown in FIG. 1. However, for clarity and simplicity, the remaining components of FIG. 1 are not shown in FIG. 3A. Array 400 of optical phase control elements is shown as including M column signal lines $50_1, 50_2 \ldots 50_M$ and N row signal lines $60_2 \ldots 60_N$. Each phase control element $70_j$ is shown as being connected to an associated row signal line and an associated column signal line. For example, phase control element $70_{11}$ is shown as being connected to row $60_1$ and column $50_1$. Similarly, phase control element $70_{NM}$ is shown as being connected to row $60_N$ and column $50_M$.

Signal col_dec selects and closes one of switches $235_j$ at any given time, where j is an index ranging from 1 to M, thereby causing all the phase control elements connected to the column signal line connected to switch $235_j$ to receive the ground potential via ground terminal 240. For example, when signal col_dec is selected to close switch $235_M$, all elements $70_{1M}$ to $70_{NM}$ coupled to column signal line $50_M$ receive the ground potential via ground terminal 240. In addition, part of the power drawn from the selected row and column is delivered to the other elements that are not in the selected row and column, thus causing the unselected phase control elements to partially receive power, thereby relaxing the update time.

Each row $60_i$ is coupled to an associated DAC $250_i$. For example, row $60_1$ is coupled to DAC $250_1$ and row $60_N$ is coupled to DAC $250_N$. Accordingly, array 400 includes as many DACs as it has rows. Therefore, by causing, for example, switch $235_1$ to close, all phase control elements coupled to column $50_1$ are programmed. In other words, by closing, for example, switch $235_1$, phase control element $70_{11}$ is coupled between DAC $250_1$ and ground terminal 240, phase control element $70_{21}$ is coupled between DAC $250_2$ and ground terminal 240, and phase control element $70_{N1}$ is coupled between DAC $250_N$ and ground terminal 240, thereby causing phase control element $70_{11}, 70_{21}, 70_{31} \ldots 70_{N1}$ to be programmed at the same time. Moreover, when delivering power to the elements, other elements not in column $70_{jl}$ also receiver power thus relaxing the update time.

In accordance with one aspect of the present invention, columns $50_j$ are caused to be connected to ground terminal 240 at regular time intervals. In other embodiments, columns $50_j$ are caused to be connected to ground terminal 240 at a constant rate. As seen from FIG. 3A, the phased array of which array 400 is a part, requires N electrical connections to DAC $250_1 \ldots 250_N$ and another one connection to the ground terminal 240. Furthermore, assuming $\tau_p$ represents the time it takes to program one phase control element $70_{ij}$, the entire array of phase control elements mat be programmed in $N_{\tau_p}$. In one embodiment DACs $250_i$ generate the same voltage for all the rows. In yet other embodiments, different DACs $250_i$ may generate different voltages.

Figure 3B:
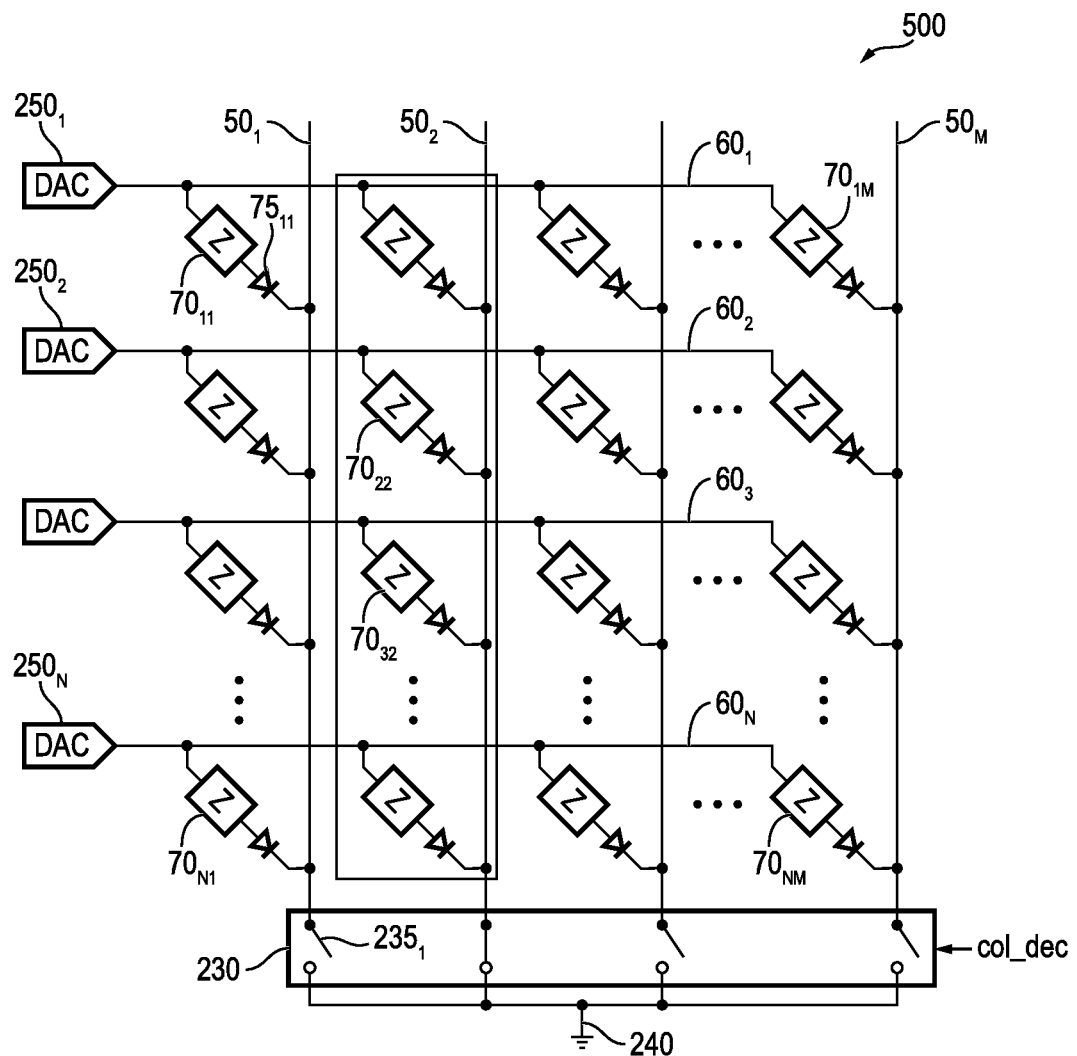
FIG. 3B is a simplified high-level block diagram of an array of phase control elements disposed along N rows and M columns, in accordance with one embodiment of the present invention.

FIG. 3B is a simplified high-level block diagram of an N×M array 500 of phase control elements, in accordance with another embodiment of the present invention. Array 500 is similar to array 400 except that in array 500, in series with each phase control element $70_{ij}$ is a diode $75_i$ that causes current to flow only in one direction from the positive to negative terminals of the diode and thus to inhibit the current flow in unselected phase control elements, as described above with respect to FIG. 2B.

Figure 4A:
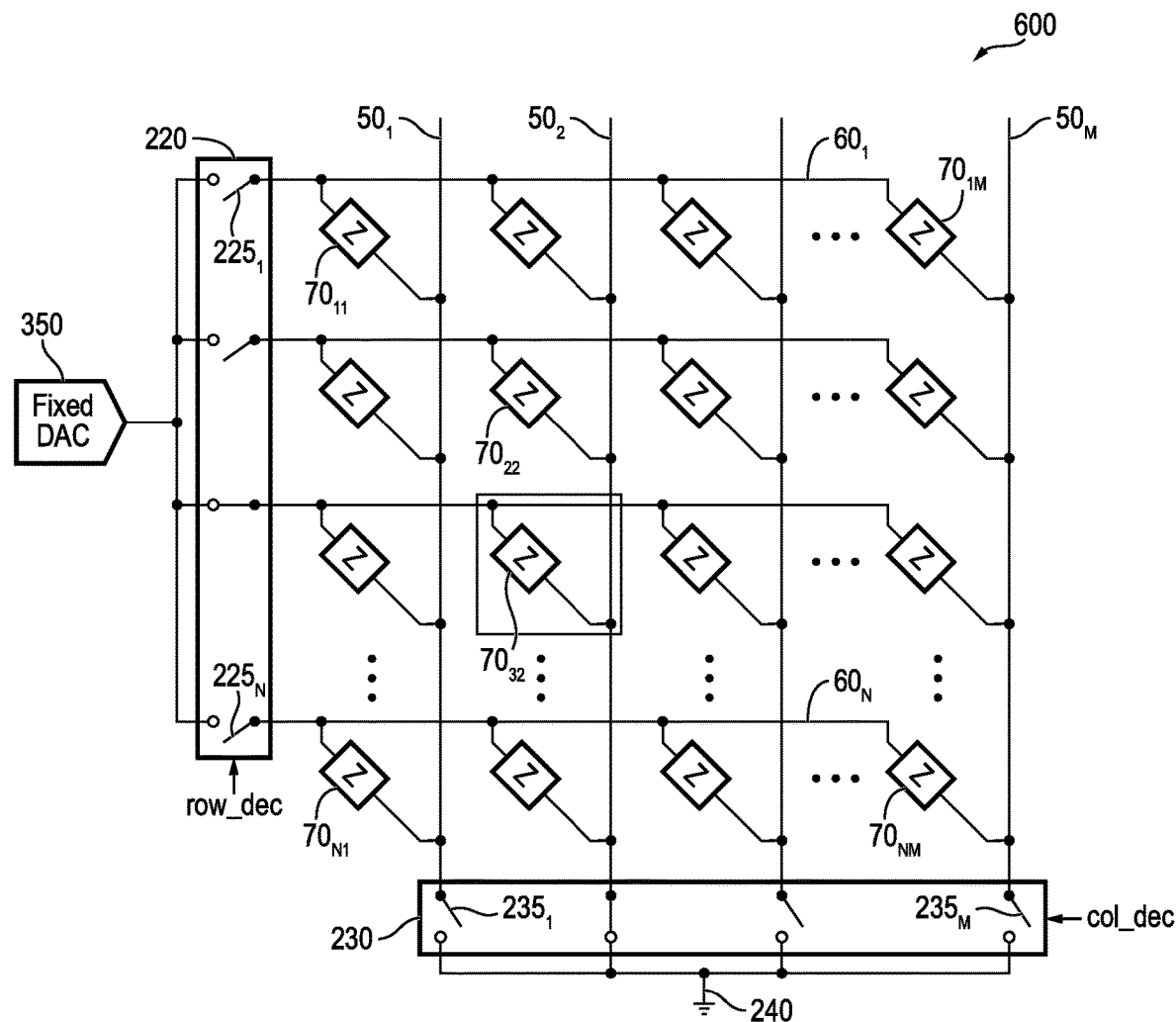
FIG. 4A is a simplified high-level block diagram of an array of phase control elements disposed along N rows and M columns, in accordance with one embodiment of the present invention.

FIG. 4A is a simplified high-level block diagram of an N×M array 600 of phase control elements, in accordance with one embodiment of the present invention. Array 600 is part of an optical phased array similar to that shown in FIG. 1. However, for clarity and simplicity, the remaining components of FIG. 1 are not shown in FIG. 4A. Array 600 of optical phase control elements is shown as including M column signal lines $50_1, 50_2 \ldots 50_M$ and N row signal lines $60_2 \ldots 60_N$. Each phase control element $70_{ij}$ is shown as being connected to an associated row signal line and an associated column signal line. For example, phase control element $70_{11}$ is shown as being connected to row $60_1$ and column $50_1$. Similarly, phase control element $70_{NM}$ is shown as being connected to row $60_N$ and column $50_M$.

At any given time during programming, signal row_dec, applied to row select block 220, selects and closes one of switches $225_i$, where i is an index ranging from 1 to N, thereby causing all the phase control elements connected to that switch's associated row to be coupled to fixed DC voltage 350. For example, when signal row_dec is selected to close switch $225_1$, all phase control elements $70_{11}$ to $70_{1M}$ are coupled to fixed DC voltage 350. Similarly, signal col_dec selects and closes one of switches $235_j$, where j is an index ranging from 1 to M, thereby causing all the phase control elements connected to that switch's associated column signal line to receive the ground potential via ground terminal 240. For example, when signal col_dec is selected to close switch $235_M$, all phase control elements $70_{1M}$ to $70_{NM}$ coupled to column signal line $50_M$ receive the ground potential. Therefore, by causing, for example, switches $225_1$ and $235_M$ to close, phase control element $70_{1M}$ is coupled between fixed DC voltage 350 and ground terminal 240, thereby causing element $70_{1M}$ to be programmed. Moreover, when delivering power to the elements, other elements not in column $70_{1M}$ also receiver power thus relaxing the update time.

Signal row_dec applied to array 500 may be a pulse-width modulated signal. Accordingly, the width of the pulse and hence the time period that each row is coupled to fixed DC voltage 350 may be varied. By controlling the pulse width of the signal applied to each switch $225_i$, the amount of power delivered to the phase control element selected in that row, and therefore the programming time of that phase control elements may be varied. In one embodiment, columns $50_j$ are caused to be connected to ground terminal 240 at regular time intervals. In other embodiments, columns $50_j$ are caused to be connected to ground terminal 240 at a constant rate. Assuming $\tau_p$ represents the time it takes to program one element $70_{ij}$, the entire array of elements is programmed in $M\tau_p$.

Assume there are N rows and M columns of phase control elements in the array. Further assume that update interval T is smaller than the time constant t of the phase control element which may be a thermal phase shifter, as described further below. The PWM signals control the rows and the selection switches control the selection of columns, as shown in FIG. 4A. The pulse-width modulated (PWM) signal may generate a pulse width between zero and $$\frac{T}{N}.$$

Assuming a pulse amplitude of A, the maximum average power programmed in the each phase control element is defined by $$\frac{A}{RN},$$

where R is the resistance of the phase control element. Therefore, as the number of the columns increases, higher amplitude pulses may be required to cover the complete range of required phase shift.

In order to keep the thermal fluctuation of the phase control elements lower than a certain value, the phase control elements may need to be updated quickly. The expression $$T_{update} < \frac{\Delta\theta}{\theta}\tau$$

provides an example of the updating speed, in which $\theta$ represents the temperature of the phase shifter, and $\Delta\theta$ represents the allowed temperature fluctuation.

Figure 4B:
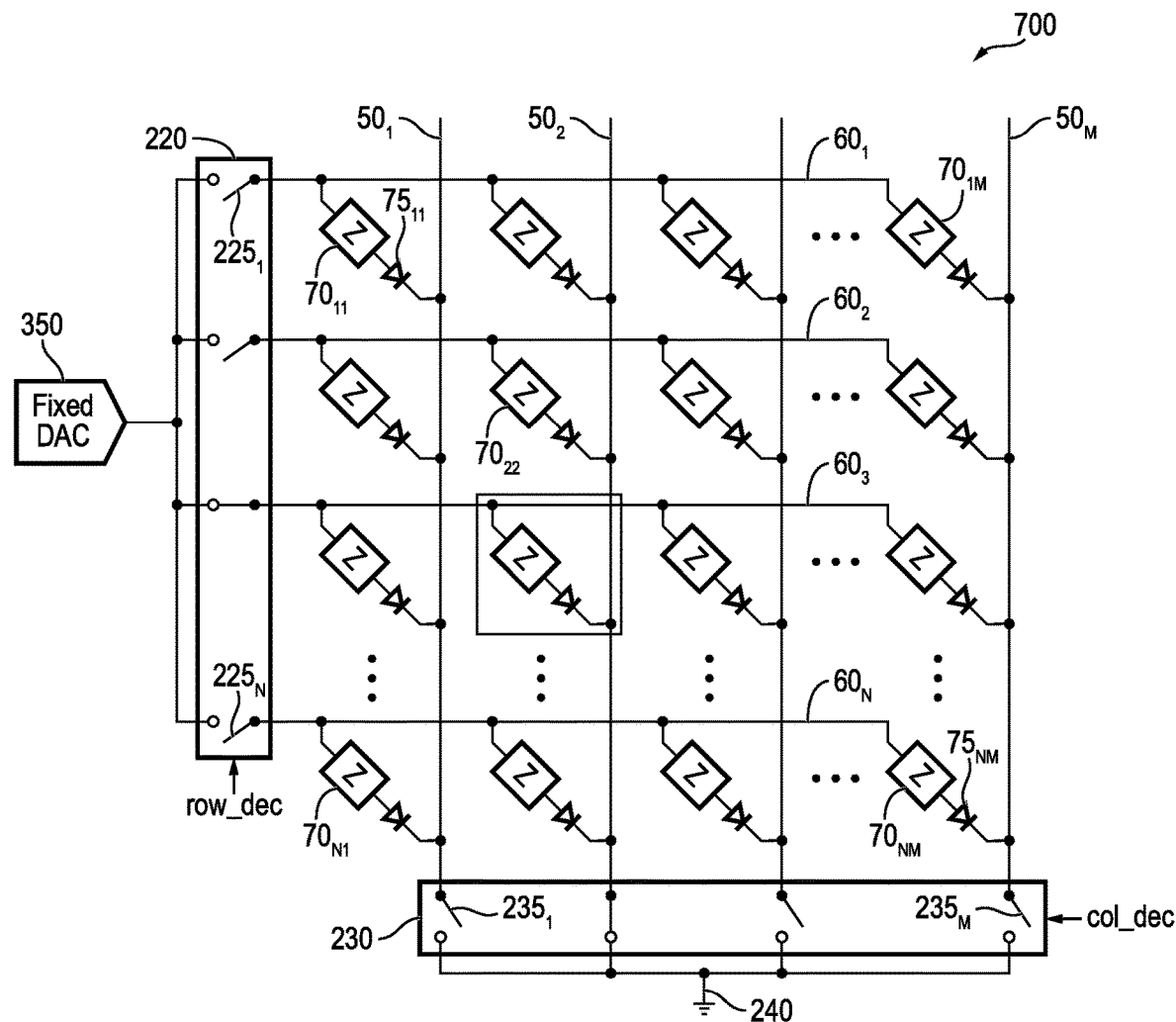
FIG. 4B is a simplified high-level block diagram of an array of phase control elements disposed along N rows and M columns, in accordance with one embodiment of the present invention.

FIG. 4B is a simplified high-level block diagram of an N×M array 700 of phase control elements, in accordance with another embodiment of the present invention. Array 700 is similar to array 600 except that in array 700, in series with each phase control element $70_{ij}$ is a diode $75_{ij}$ that causes current to flow only in one direction from the positive to negative terminals of the diode and thus to inhibit the current flow in unselected phase control elements, as described above with respect to FIG. 2B.

Figure 5A:
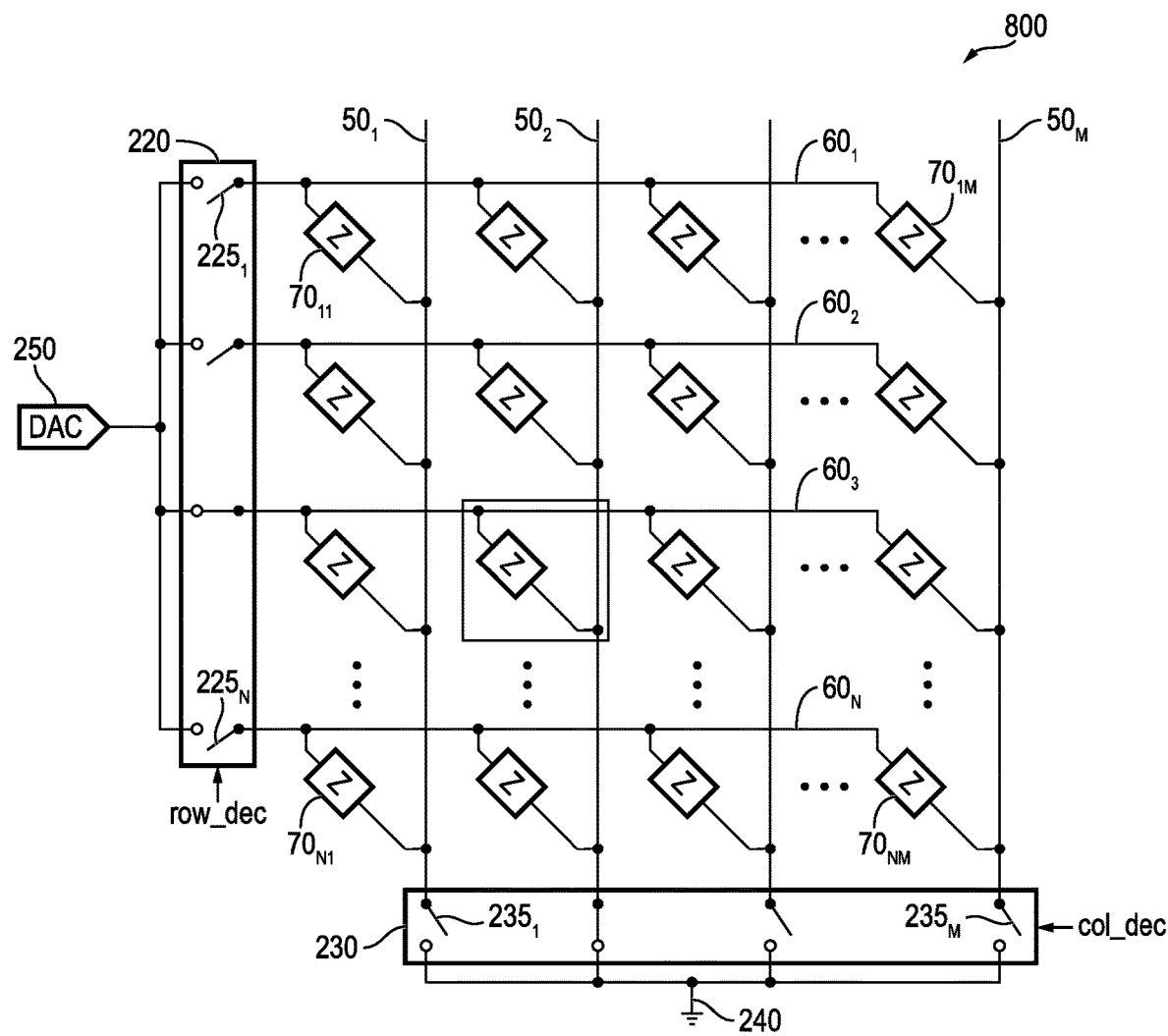
FIG. 5A is a simplified high-level block diagram of an array of phase control elements disposed along N rows and M columns, in accordance with one embodiment of the present invention.

FIG. 5A is a simplified high-level block diagram of an N×M array 800 of phase control elements, in accordance with one embodiment of the present invention. Array 800 is part of an optical phased array similar to that shown in FIG. 1. However, for clarity and simplicity, the remaining components of FIG. 1 are not shown in FIG. 5A. Array 800 of optical phase control elements is shown as including M column signal lines $50_1, 50_2 \ldots 50_M$ and N row signal lines $60_2 \ldots 60_N$. Each phase control element $70_{ij}$ is shown as being connected to an associated row signal line and an associated column signal line. For example, phase control element $70_{11}$ is shown as being connected to row $60_1$ and column $50_1$. Similarly, phase control element $70_{NM}$ is shown as being connected to row $60_N$ and column $50_M$.

At any given time during programming, signal row_dec selects and closes one of switches $225_i$, where i is an index ranging from 1 to N, thereby causing all the phase control elements connected to that switch's associated row signal line to be coupled to the voltage supplied by DAC 250. For example, when signal row_dec is selected to close switch $225_1$, all phase control elements $70_{11}$ to $70_{1M}$ are coupled to DAC 250. Similarly, signal col_dec selects and closes one of switches $235_j$, where j is an index ranging from 1 to M, thereby causing all the phase control elements connected to the column signal line connected to switch $235_j$ to receive the ground potential via ground terminal 240. For example, when signal col_dec is selected to close switch $235_M$, all phase control elements $70_M$ to $70_{NM}$ are coupled to column signal line $50_M$. Therefore, by causing, for example, switches $225_1$ and $235_M$ to close, phase control element $70_{1M}$ is coupled between DAC 250 and ground terminal 240, thereby causing phase control element $70_{1M}$ to be programmed. Moreover, when delivering power to the elements, other elements not in column $70_M$ also receiver power thus relaxing the update time.

Signal row_dec applied to array 500 may be a pulse-width modulated signal. Accordingly, the width of the pulse and hence the time period that each row is coupled to DAC 250 may be varied. By controlling the pulse width of the signal applied to each switch $225_i$, the amount of power delivered to selected phase control element, and therefore the programming time of that phase control element may be varied. In one embodiment, columns $50_j$ are caused to be connected to ground terminal 240 at regular time intervals. In other embodiments, columns $50_j$ are caused to be connected to ground terminal 240 at a constant rate. Assuming $\tau_p$ represents the time it takes to program one element $70_{ij}$, the entire array of elements is programmed in $M\tau_p$.

Figure 5B:
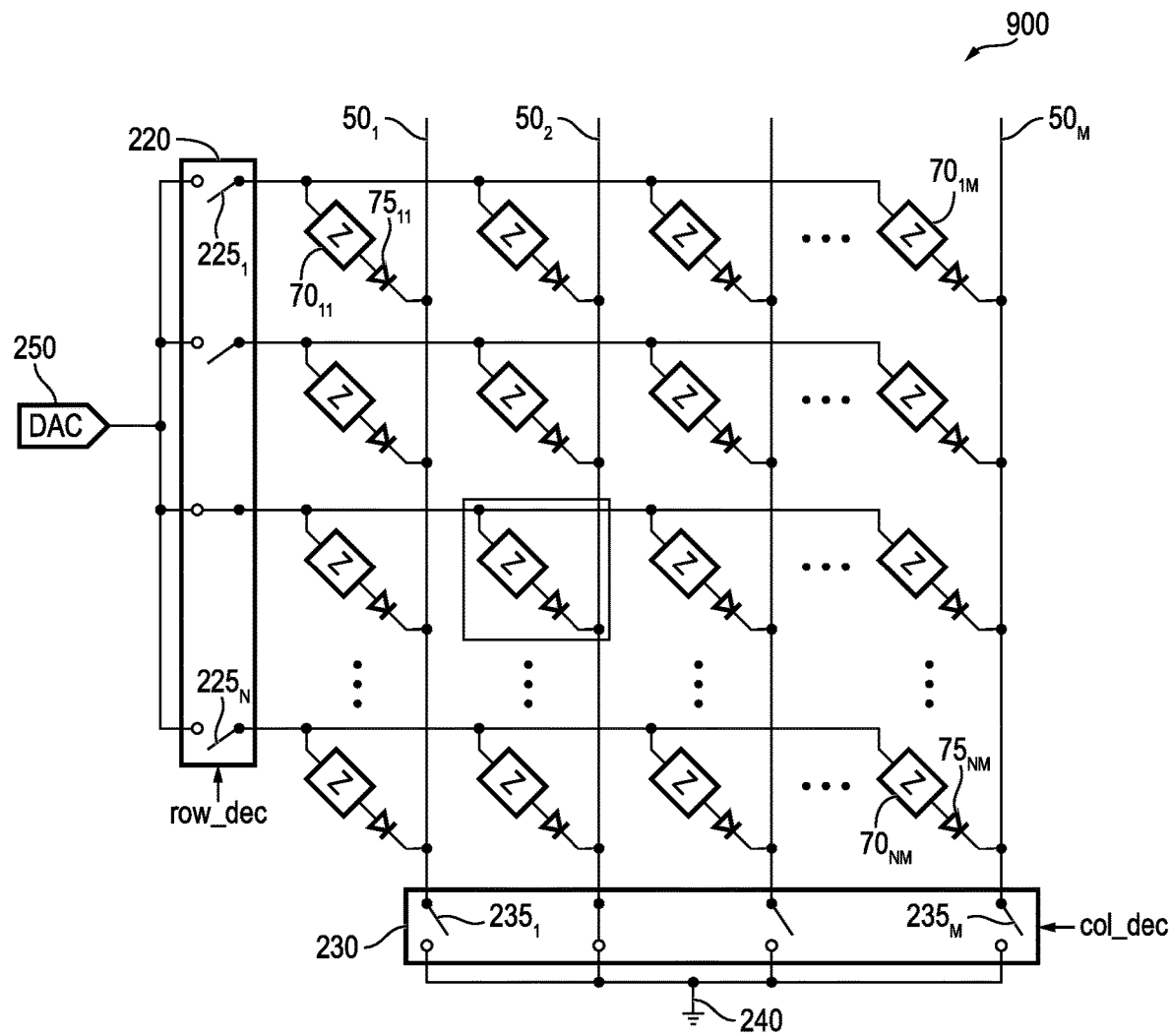
FIG. 5B is a simplified high-level block diagram of an array of phase control elements disposed along N rows and M columns, in accordance with one embodiment of the present invention.

FIG. 5B is a simplified high-level block diagram of an N×M array 900 of phase control elements, in accordance with another embodiment of the present invention. Array 900 is similar to array 800 except that in array 900, in series with each phase control element $70_{ij}$ is a diode $75_i$ that causes current to flow only in one direction from the positive to negative terminals of the diode and thus to inhibit the current flow in unselected phase control elements, as described above with respect to FIG. 2B.

Figure 6A:
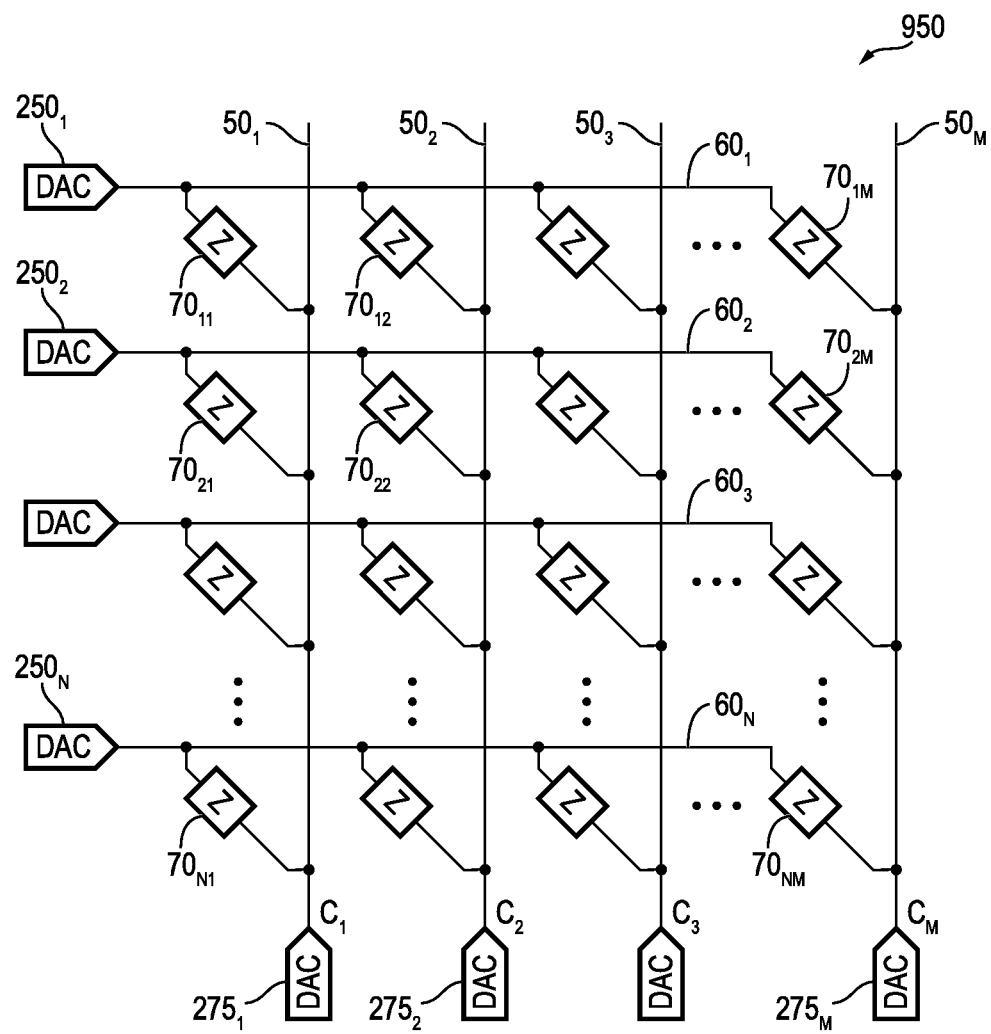
FIG. 6A is a simplified high-level block diagram of an array of phase control elements disposed along N rows and M columns, in accordance with one embodiment of the present invention.

FIG. 6A is a simplified high-level block diagram of an N×M array 950 of phase control elements, in accordance with one embodiment of the present invention. Array 950 is part of an optical phased array similar to that shown in FIG. 1. However, for clarity and simplicity, the remaining components of FIG. 1 are not shown in FIG. 6A. Array 950 of optical phase control elements is shown as including M column signal lines $50_1$, $50_2$ ... $50_M$ and N row signal lines $60_2$ ... $60_N$. Each phase control element $70_{ij}$ is shown as being connected to an associated row signal line and an associated column signal line. For example, phase control element $70_{11}$ is shown as being connected to row $60_1$ and column $50_1$. Similarly, phase control element $70_{NM}$ is shown as being connected to row $60_N$ and column $50_M$.

Each row $60_i$ is coupled to an associated DAC $250_i$. For example, row $60_1$ is coupled to DAC $250_1$ and row $60_N$ is coupled to DAC $250_N$. Each column $75_j$ is coupled to an associated DAC $275_i$. For example, column $75_1$ is coupled to DAC $275_1$ and column $75_M$ is coupled to DAC $275_N$. Since in array 950, each row and each column is connected to a different variable voltage source or a DAC, array 950 includes M+N DACs.

Figure 6B:
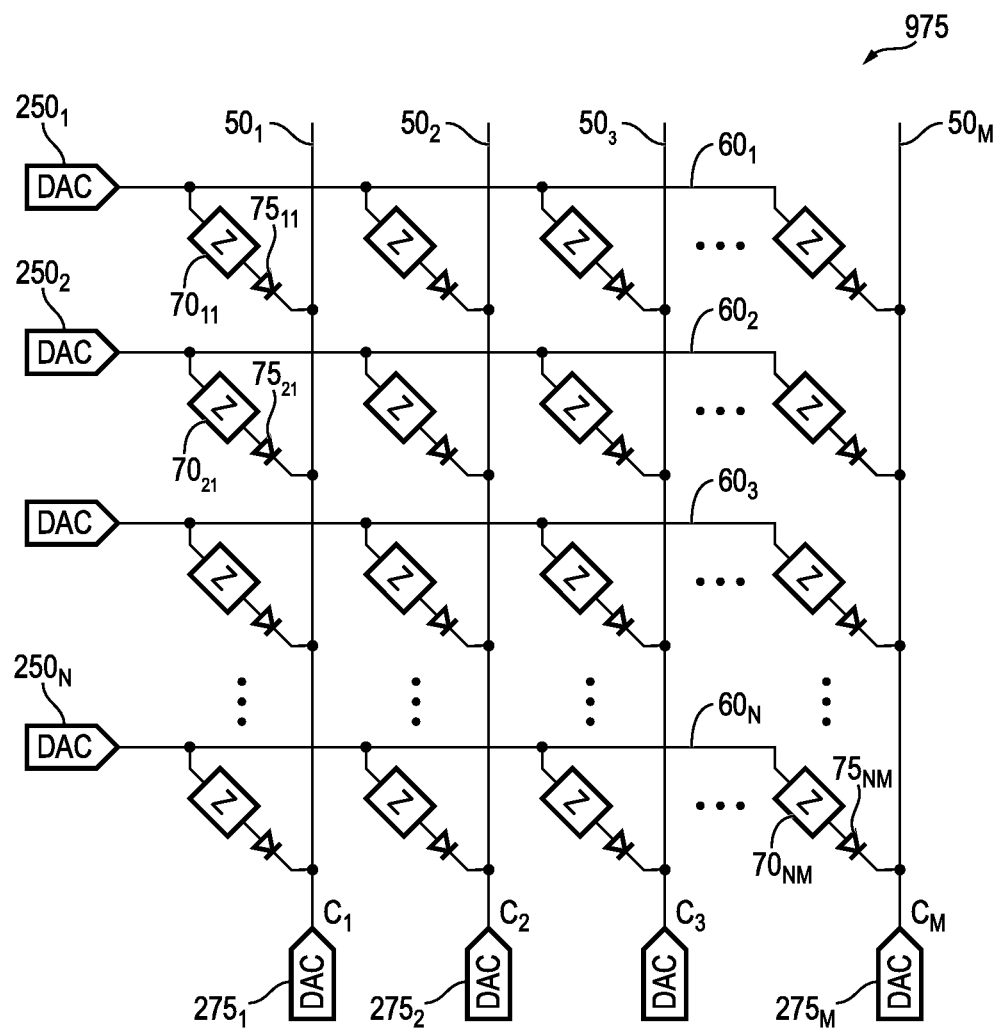
FIG. 6B is a simplified high-level block diagram of an array of phase control elements disposed along N rows and M columns, in accordance with one embodiment of the present invention

FIG. 6B is a simplified high-level block diagram of an N×M array 975 of phase control elements, in accordance with another embodiment of the present invention. Array 975 is similar to array 950 except that in array 975, in series with each phase control element $70_i$ is a diode $75_i$ that causes current to flow only in one direction from the positive to negative terminals of the diode and thus to inhibit the current flow in unselected phase control elements, as described above with respect to FIG. 2B. Diodes 75 may be internal to phase control elements $70_{ij}$ or may be external.

To have enough degrees of freedom for delivering a specific amount of power to each element, some or all the voltage sources may be continuously varying over time. Assuming the voltage of $V_i(t)$ on row $r_i$ and $V_j(t)$ on column $c_j$, the power delivered to the element at the cross-section of $r_i$ and $c_j$ at period T is $$P_{ij} = \frac{1}{T} \int \frac{(V_i(t) - V_j(t))^2}{R} dt$$

in which R is the resistance of the element. Therefore, the delivered power is related to the distance between two functions $V_i(t)$ and $V_j(t)$. In the case of a DAC, the voltages change with steps and are not continuous functions. However, this equation holds for discontinuous voltage functions as well.

Figure 7:
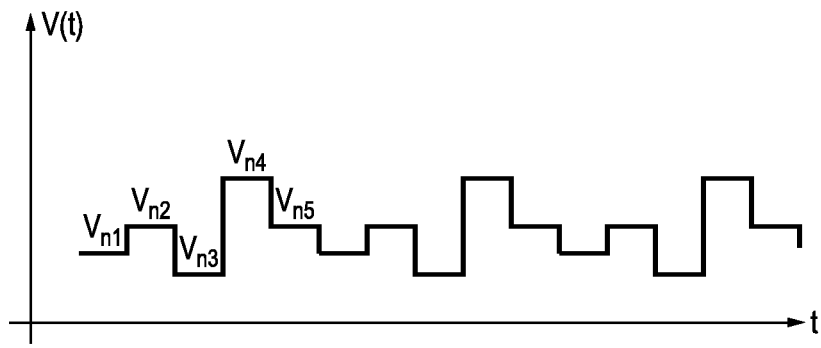
FIG. 7 shows a discontinuous voltage function that may be generated by an analog-to-digital converter and applied to some embodiments of the present invention.

A special case is a discontinuous voltage function as shown in FIG. 7, which is periodic over time. This sequence of voltages $V_{n1}, V_{n2}, \ldots, V_{nk}$ can be generated using a DAC. Putting this sequence of voltages in a vector form as $\vec{V}_n = (V_{n1}, V_{n2}, \ldots, V_{nk})$ which are connected to the row $r_n$ and $\vec{V}_m = (V_{m1}, V_{m2}, \ldots, V_{mk})$ to column $C_m$, a voltage vector in $R^k$ for each row and column is obtained. Therefore, the delivered power to the element at $r_n$ and $c_m$ is $$P_{nm} = \frac{|\vec{V}_n - \vec{V}_m|^2}{NR}$$

which is related to the distance between two vectors $\vec{V}_n$ and $\vec{V}_m$. (N is the number of steps in each period)

As a result, each row and column can be considered a point in a function space or in $R^k$. Having the set of desired power for each element gives the set of distances between these points. The unknowns are the actual vertices of these points. Using the knowledge of distance geometry, a solution may be found for the vertices of each point to deliver the desired power to each element.

Figure 8A:
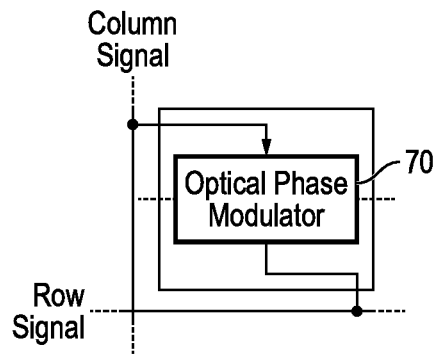
FIG. 8A shows a phase control element having an internal memory.
Figure 8B:
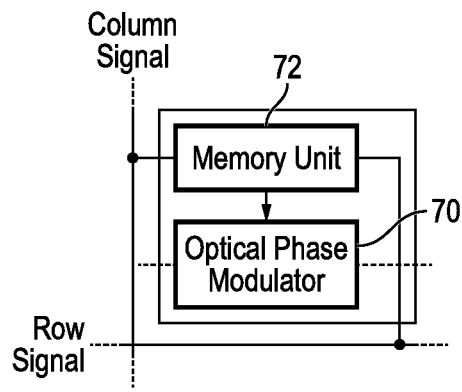
FIG. 8B shows a phase control element having an external memory.
Figure 8C:
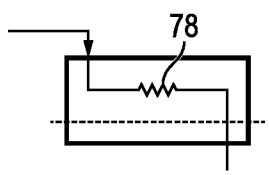
FIG. 8C shows a resistive element associated with a phase control element shown in FIG. 8A.

Associated with each phase control element $70_{ij}$ (alternatively referred to herein as phase modulator element, phase modulator, or element 70) described above is a memory that may be internal or external to that phase control element 70. FIG. 8A shows a phase control element 70 with an internal memory. FIG. 8B shows a phase control element 70 having an associated external memory 72. FIG. 8C shows the resistive element 78 associated with a phase control element 70 as shown in FIG. 8A. By applying a voltage to the phase control element and hence to the resistive element 78, the temperature of the phase control element and therefore the amount of phase shift generated by the phase control element may be varied.

In one embodiment, a phase control element with an internal memory may be a thermo-refractive phase modulator. Such a phase modulator (or phase shifter) typically has a response with intrinsic time constant or thermal decay rate of the order of, for example, 1 μs to 10 ms. The response time constant corresponds to the memory of the phase modulator. In such embodiments, the array is refreshed in a shorter time than the time constant of the thermal phase shifter. Such embodiments thus require a refresh rate faster than the thermal decay rate of each phase control element disposed therein.

In one embodiment, a phase control element with an internal memory may be a capacitive phase control element that can be charged and discharged at each cycle. Unlike a thermal phase shifter, a capacitive phase shifter does not require continuous refreshing to retain its value.

Figure 9A:
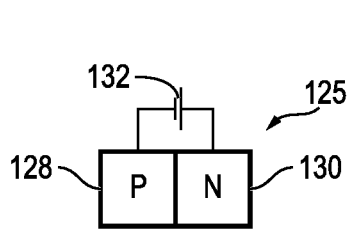
FIG. 9A shows a p-n diode capacitive phase modulator.

In one embodiment, a capacitive phase control element may be a P-N junction diode 125 as shown in FIG. 9A. Diode 125 is shown as including a p-doped region 128 and an n-doped region 130. By reverse biasing the diode using voltage supply 132, the depletion region width of the P-N junction and hence its capacitance may be changed. By changing the capacitance of the diode, its index of refraction and therefore the degree of phase modulation provided by the diode may vary.

Figure 9B:
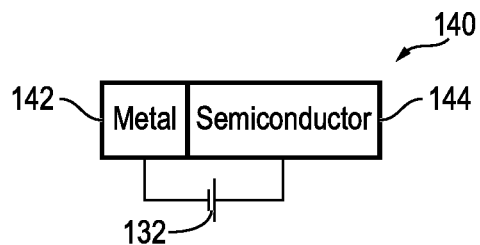
FIG. 9B shows a Schottky diode capacitive phase modulator.

In one embodiment, as shown in FIG. 9B, a capacitive phase control element may be a Schottky diode 140 formed between a metal 142 and a semiconductor 144. By reverse biasing the Schottky diode using voltage supply 132, the depletion region width of the diode and hence its capacitance may be changed. By changing the capacitance of the diode, its index of refraction and therefore the degree of phase modulation provided by the diode may vary. A capacitive optical modulator that operates based on charge accumulation or depletion, as shown in FIGS. 9A and 9B, has a time-constant associated with the carrier transport speed. In a capacitive optical modulator, the refresh rate is selected to be higher than the carrier transport time.

Figure 9C:
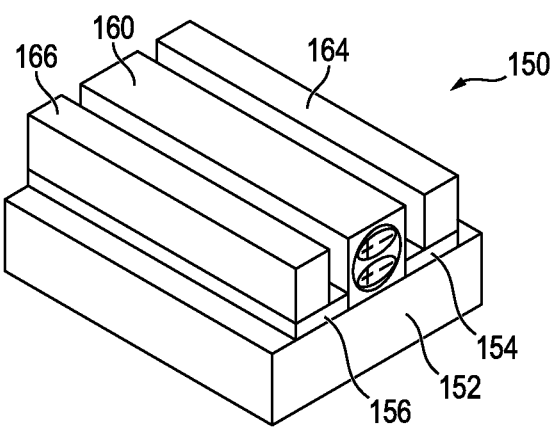
FIG. 9C shows a capacitive phase modulator whose dipole molecules' polarity may be varied.

In one embodiment, a phase control element with an internal memory may be a capacitive phase modulator that operates based on the polarity of its dipole molecules. FIG. 9C is a simplified perspective view of an exemplary capacitive phase modulator 150 shown as including an n-type semiconductor region 156 and a p-type semiconductor region 154 formed above silicon dioxide substrate 152. Formed above n-type and p-type regions 154 and 156 are metal layers 166 and 164, respectively. Disposed between n-type region 156 and a p-type region 154 is a polymer layer 160 that has a second order non-linearity. By changing the polarity of the voltage applied to layer 60, the direction of the molecular dipole present in layer 60 is varied. The polarity of the dipole molecules is used as a memory if the refresh rate is selected to be greater than the relaxation time of the dipole or polar molecules.

Figure 10A:
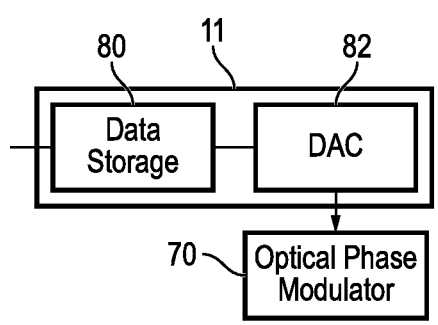
FIG. 10A is a simplified schematic block diagram of a memory external to a phase control element.

As was describe above, the memory may be external to the phase modulator element. FIG. 10A is a simplified schematic block diagram of a memory 11 external to a phase control element 70. Memory 11 is shown as including, in part, a data storage unit 80 as well as a DAC 82. In one example, the data storage unit 80 is a shift register that supplies its data to DAC 82. The digital value stored in shift register 80 is converted to an analog voltage and applied to phase control element 70. The shift register may be updated every time the switching circuitry enables its associated phase control element.

Figure 10B:
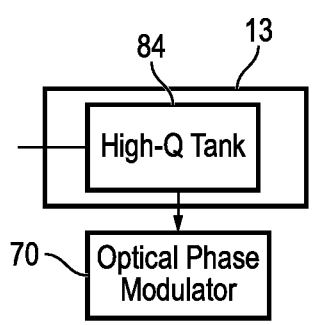
FIG. 10B is a simplified schematic block diagram of a memory external to a phase control element.

FIG. 10B is a simplified schematic block diagram of an exemplary memory external to phase control element 70. Memory 13 may be a high-Q tank that may be a capacitor-inductor (LC) tank. The high-Q tank 84 maintains its voltage value until next refresh cycle. The refresh rate is selected to be greater than the decay rate of the tank.

For a phase modulator element with internal memory, a diode may be placed in series with the internal memory element, as shown in FIGS. 2B, 3B, 4B and 5B. As described above, when rows and columns are multiplexed, depending on the configuration of the matrix, either a single element, a column of elements, or a row of elements are programmed at the same time. If there are M columns and each programming takes $T_0$ time, then each element will need to be programmed at $$\frac{T_0}{M}$$

period of the time, assuming a worst case scenario. This results in two constraints. Each modulator element needs to be programmed at $$\frac{T_0}{M}$$

time cycle. In addition, each modulator element should be able to retain the programmed phase during the $$\frac{T_0}{M}$$

period for the entire time $T_0$ until next programmed cycle is reached. The decay time $\tau_d$ of the modulator is selected to be less than $T_0$. If the programming time is $\tau_p$, then $$\tau_p \geq \frac{T_0}{M} \gg \tau_d.$$

Figure 11:
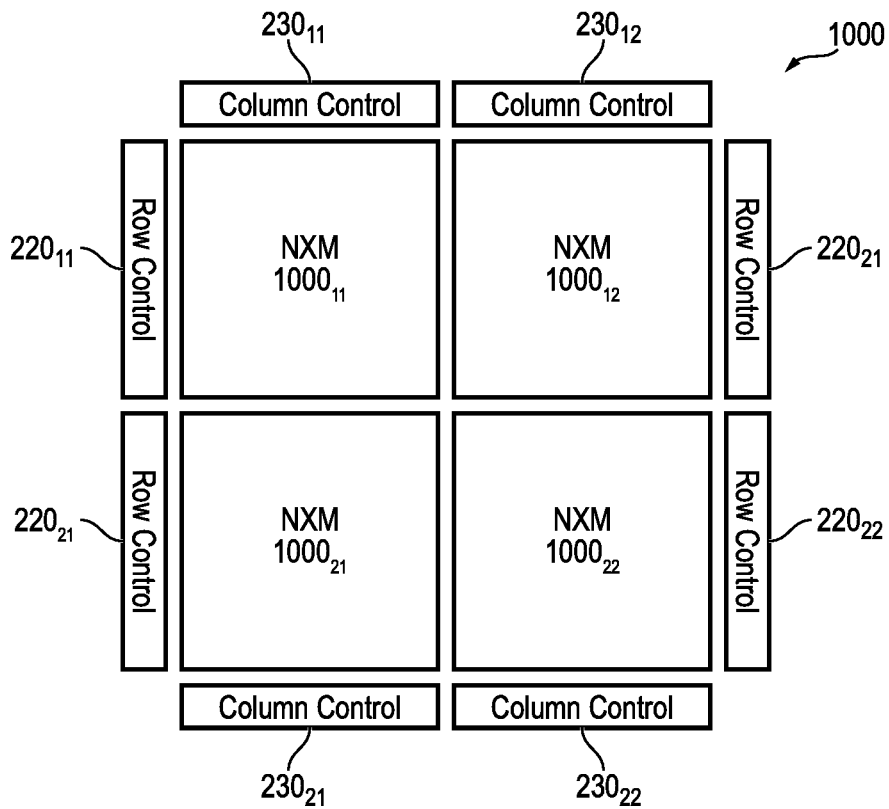
FIG. 11 is a simplified high-level block diagram of an array of phase control elements that is divided into subarrays, in accordance with one embodiment of the present invention.

As more elements are integrated into the array, the programming speed is increased to prevent fluctuation in the programmed phase values. In accordance with one embodiment, in order to maintain the updating time interval without increasing the programming speed, the array is divided into smaller sub-arrays. For example, array 1000 shown in FIG. 11 is formed using 4 subarrays 1000$_{11}$, 1000$_{12}$, 1000$_{21}$ and 1000$_{21}$ of N×M phase control elements. Each subarray, which may correspond to any of the N×M arrays described above (for example, FIG. 2A), is shown as including a dedicated row select block and a dedicated column select block. For example, subarray 1000$_{11}$ is shown as having row select block 220$_{11}$ and column select block 230$_{11}$.

Figure 12:
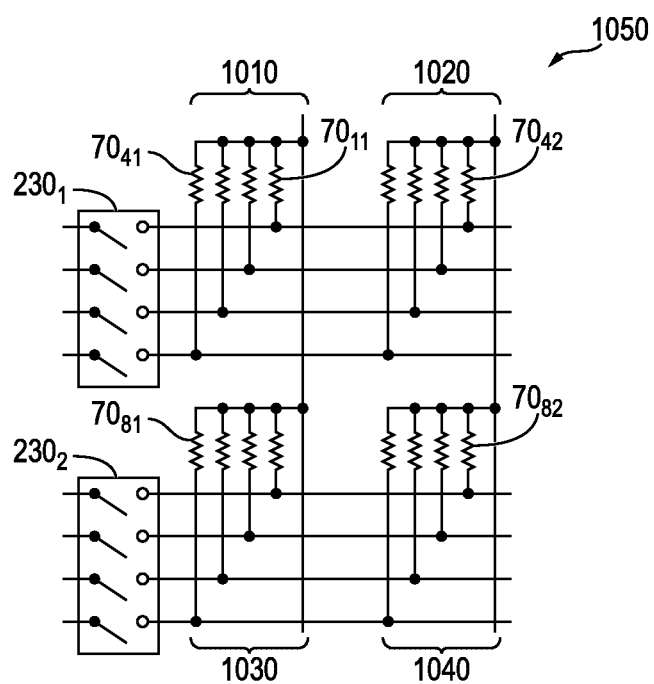
FIG. 12 is a simplified high-level block diagram of an array of phase control elements that is divided into subarrays, in accordance with one embodiment of the present invention.

FIG. 12 shows an array 1050 of 16 phase control elements 70$_{ij}$ arranged along 8 rows and 2 columns. As seen, array 1050 is divided into 4 subarrays 1010, 1020, 1030 and 1040 each of which is a 4×1 array of phase control elements in this example.

Figure 13:
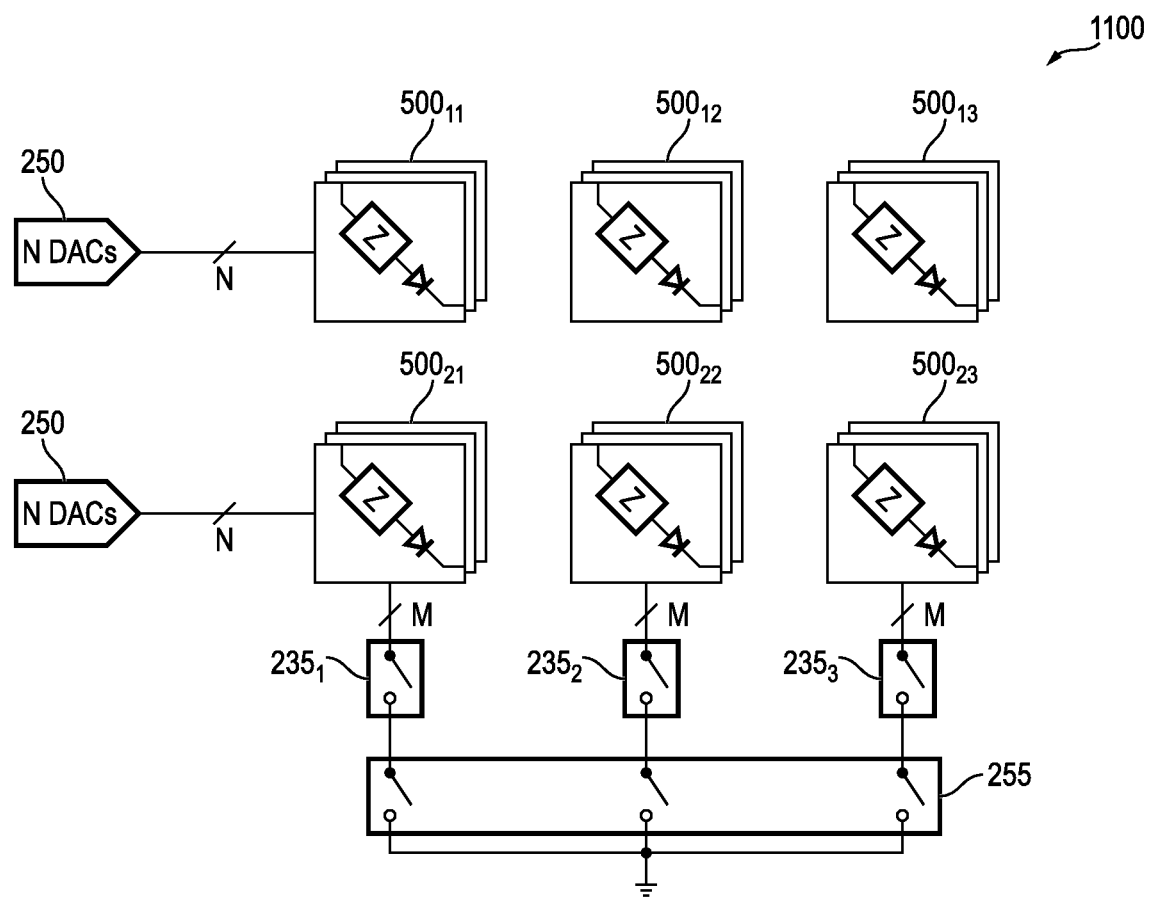
FIG. 13 is a simplified high-level block diagram of an array of phase control elements that is divided into subarrays, in accordance with one embodiment of the present invention.

FIG. 13 shows an array 1100 of phase control elements, in accordance with another embodiment of the present invention. Array 1100 is shown as including 2×3 subarrays 500$_{11}$, 500$_{12}$, 500$_{13}$, 500$_{21}$, 500$_{22}$ and 500$_{23}$ each of which subarrays is similar to array 500 shown in FIG. 3B. Switch blocks 235$_1$, 235$_2$ and 235$_3$ are adapted to select one of the columns from the subarrays they are coupled to. Switch block 255 is adapted to select one subarray column from among the 3 subarray columns.

The above embodiments of the present invention are illustrative and not limitative. Embodiments of the present invention are not limited by any specific frequency or wavelength of the optical signal, the size of the array, the type of phase control element, and the like. Other additions, subtractions or modifications are obvious in view of the present disclosure and are intended to fall within the scope of the appended claims

What is claimed is:

1. An optical phased array comprising:
   a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M;
   a row select block having N switches each configured to couple one of the N rows of the phase control elements to a digital-to-analog converter (DAC) in response to a row select signal; and
   a column select block having M switches each configured to couple one of the M rows of the phase control elements to a ground terminal in response to a column select signal.

2. The optical phased array of claim 1 further comprising N×M diodes each coupled in series to a different one of the N×M phase control elements.

3. The optical phased array of claim 1 wherein each phase control element has an internal memory.

4. The optical phased array of claim 3 wherein each phase control element is a thermal phase shifter.

5. The optical phased array of claim 3 wherein each phase control element is a capacitive phase shifter.

6. The optical phased array of claim 5 wherein each capacitive phase shifter is a P-N diode.

7. The optical phased array of claim 5 wherein each capacitive phase shifter is a Schottky diode.

8. The optical phased array of claim 5 wherein each capacitive phase shifter includes a layer of polymer having dipole molecules whose polarity is varied.

9. The optical phased array of claim 1 wherein each phase control element includes a memory external to the phase control element.

10. The optical phased array of claim 1 wherein each external memory comprises a shift register and a DAC.

11. The optical phased array of claim 1 wherein the row select signal is a pulse-width modulated signal.

12. The optical phased array of claim 1 wherein the row select signal is controlled to select between different N row switches at a first constant rate.

13. The optical phased array of claim 12 wherein the column select signal is controlled to select between different N column switches at a second constant rate.

14. The optical phased array of claim 13 wherein said first constant rate is substantially equal to the second constant rate.

15. The optical phased array of claim 1 wherein said DAC is external to the array.

16. An optical phased array comprising:
   a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M, wherein each row signal line is coupled to a different one of N digital-to-analog converters (DACs); and
   a column select block having M switches each configured to couple one of the M rows of the phase control elements to a ground terminal in response to a column select signal.

17. The optical phased array of claim 16 further comprising N×M diodes each coupled in series to a different one of the N×M phase control elements.

18. An optical phased array comprising:
   a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M;
   a row select block having N switches each configured to couple one of the N rows of the phase control elements to a fixed DC voltage supply in response to a row select signal, wherein said row select signal is a pulse-width modulated signal; and
   a column select block having M switches each configured to couple one of the M rows of the phase control elements to a ground terminal in response to a column select signal.

19. The optical phased array of claim 18 further comprising N×M diodes each coupled in series to a different one of the N×M phase control elements.

20. An optical phased array comprising:
   a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M, wherein each row signal line is coupled to a different one of a first N digital-to-analog converters (DACs), and wherein each column signal line is coupled to a different one of a second M DACs.

21. The optical phased array of claim 20 further comprising N×M diodes each coupled in series to a different one of the N×M phase control elements.

22. A method of forming an optical phased array comprising:
   forming a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M;
   forming a row select block having N switches each configured to couple one of the N rows of the phase control elements to a digital-to-analog converter (DAC) in response to a row select signal; and
   forming a column select block having M switches each configured to couple one of the M rows of the phase control elements to a ground terminal in response to a column select signal.

23. A method of forming an optical phased array comprising:
   forming a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M, wherein each row signal line is coupled to a different one of N digital-to-analog converters (DACs); and
   forming a column select block having M switches each configured to couple one of the M rows of the phase control elements to a ground terminal in response to a column select signal.

24. A method of forming an optical phased array comprising:
   forming a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M;
   forming a row select block having N switches each configured to couple one of the N rows of the phase control elements to a fixed DC voltage supply in response to a row select signal, wherein said row select signal is a pulse-width modulated signal; and
   forming a column select block having M switches each configured to couple one of the M rows of the phase control elements to a ground terminal in response to a column select signal.

25. A method of forming an optical phased array comprising:
   forming a plurality of phase control elements disposed along N rows and M columns forming an N×M array, wherein phase control elements disposed along an $i^{th}$ row are coupled to an $i^{th}$ row signal line and phase control elements disposed along a $j^{th}$ column are coupled to a $j^{th}$ column signal line, wherein N and M are positive integers, wherein i is a row index varying from 1 to N, and wherein j is a column index varying from 1 to M, wherein each row signal line is coupled to a different one of a first N digital-to-analog converters (DACs), and wherein each column signal line is coupled to a different one of a second M DACs.

* * * * *